United States Patent [19]
Held et al.

[11] Patent Number: 5,602,515
[45] Date of Patent: Feb. 11, 1997

[54] HIGH-FREQUENCY GENERATOR WITH HARMONIC-TUNED RESONANT CIRCUITS

[75] Inventors: Michael Held; Jochen Stahl, both of Berlin, Germany

[73] Assignee: Siemens Aktiengesellschaft, München, Germany

[21] Appl. No.: 520,278

[22] Filed: Aug. 28, 1995

[30] Foreign Application Priority Data

Aug. 26, 1994 [DE] Germany .......................... 44 31 381.0

[51] Int. Cl.[6] .................................................. H03B 5/10
[52] U.S. Cl. .................... 331/170; 331/114; 331/117 R; 331/181; 331/117 FE
[58] Field of Search ............................... 331/114, 116 R, 331/116 FE, 117 R, 117 FE, 158, 159, 162, 164, 167–171, 172, 181

[56] References Cited

U.S. PATENT DOCUMENTS

| 1,848,126 | 3/1932 | Heising ........................ 331/167 X |
| 2,115,858 | 5/1938 | Keall ........................... 331/167 X |
| 2,831,116 | 4/1958 | Hahnel ......................... 331/167 X |

FOREIGN PATENT DOCUMENTS

| 0404179 | 10/1924 | Germany . |
| 0595408 | 3/1934 | Germany . |

OTHER PUBLICATIONS

Taschenbuch der Hochfrequenztechnik, Springer–Verlag, Berlin, DE, (1956) by H. Meinke et al.; pp. 955–957.

Taschenbuch der Hochfrequenztechnik, Springer–Verlag, Berlin, DE, (1992) by K. Lange et al.: *Grundlagen, Komponenten, Systeme*; pp. 76–77.

Elektronik, Jun. 1956, No. 5, pp. 136–138, K. Steimfi, Ulm, DE: *Über Röhrengeneratoren mit höchstem Wirkungsgrad*.

IEEE Transactions on Broadcasting, vol. BC–31, No. 2, Jun. 1985, pp. 34–39, Z. Zivkovic: *Third Harmonic Injection Increasing the Efficiency of High–Power HF Amplifiers*.

*Primary Examiner*—David Mis
*Attorney, Agent, or Firm*—Kenyon & Kenyon

[57] ABSTRACT

In order to improve the efficiency of a self-starting high-frequency generator, where for self-starting power is fed back from the anode circuit to the control grid of the grid-controlled electron tube used as amplifier element, the following measures are provided. An additional oscillating circuit ($L_{A3}$, $C_{A3}$) which is tuned to a multiple of the operating frequency ($f_1$) is arranged in the anode circuit. An oscillating circuit ($L_{G31}$, $L_{G32}$, $C_{G3}$) tuned to a multiple of the operating frequency ($f_1$) is likewise arranged in the control-grid circuit. Components ($L_{G31}$) belonging to the feedback circuit are at the same time components of the oscillating circuit arranged in the control-grid circuit.

18 Claims, 1 Drawing Sheet

HIGH-FREQUENCY GENERATOR WITH HARMONIC-TUNED RESONANT CIRCUITS

BACKGROUND OF THE INVENTION

The present invention relates generally to high frequency generators and more specifically to a self-starting high-frequency generator, in which in the anode circuit of a grid-controlled electron tube there are arranged an oscillating circuit tuned to the operating frequency and a further oscillating circuit tuned to three times the operating frequency and where a feedback circuit is provided for the feedback of power from the anode circuit to the control grid.

Electronic circuits in the form of self-starting high-frequency generators have long been known in the art ("Taschenbuch der Hochfrequenztechnik", Authors: Meinke & Gundlach, Springer-Verlag, 1956, pages 955 to 957/1992, page M76/77). The feedback of power from the anode circuit to the control grid can take place in different ways, for example by means of the so-called Meißner circuit which consists of a frequency-independent transformer feedback in combination with an oscillating circuit arranged in the anode circuit or also by means of a push-pull circuit with capacitive voltage division. In the development of such electronic circuits it is desired, among other things, to achieve the conversion of DC power into AC power associated with these circuits as efficiently as possible. Previously this has been achieved in practice with a so-called class-C-operation (small current-flow angle) and with the realization of a sinusoidal alternating-voltage characteristic, which is as uncorrupted as much as possible, at the anode and the controlled electrode of the grid-controlled tube used.

To improve the efficiency of high-frequency generators it has already been suggested that one or more additional oscillating circuits be arranged in the anode circuit, which oscillating circuits are tuned to the third harmonic or to the third and the fifth harmonic of the fundamental frequency, and that the feedback of power from the anode circuit to the control grid be undertaken with the aid of an amplifier or by means of a diode and additional countervoltage source in such a way that the grid is controlled with an approximate square-wave voltage (DE 404 179; "Elektronik", 1956, pages 136 to 138).

Moreover, in the field of amplifier technology, in particular with radio transmitters, it is known in itself to increase the efficiency of the amplifier operation by the specific addition of the third harmonic to the fundamental wave. This so-called 3-H-operation or D-operation is repeatedly described in the relevant literature (among other things BBC-Mitteilungen 7–80, pages 444 to 448, DE 595 408).

The present invention is directed to the problem of reducing the expenditure in terms of circuit engineering for the feedback of power from the anode circuit to the control grid in a circuit of a high frequency generator of the type discussed above.

SUMMARY OF THE INVENTION

The present invention solves this problem by providing an electronic circuit arrangement forming a self-starting high-frequency generator that includes:

- a grid-controlled electron tube having an anode circuit and a control-grid circuit;
- an oscillating circuit in the anode circuit tuned to the operating frequency;
- a further oscillating circuit in the anode circuit tuned to a multiple of the operating frequency;
- a feedback circuit for the feedback of power from the anode circuit to the control-grid circuit; and
- an oscillating circuit in the control-grid circuit tuned to said multiple of the operating frequency, and having at least one component in common with the feedback circuit.

In such a development of the circuit arrangement only passive switching elements are used for the feedback, i.e. the feedback path is self-sustaining and automatically stabilized.

With the use of a Meißner circuit to couple the control grid by means of a transformer to the anode oscillating circuit tuned to the operating frequency, in a development of the invention the feedback circuit is formed in such a way that the secondary winding of the transformer forms at least part of the inductance of the oscillating circuit which is arranged in the control-grid circuit. With a high-frequency generator constructed as push-pull generator, where the respective feedback circuit consists of a capacitive voltage divider, which is supplied by the anode voltage of the respective push-pull side, the feedback circuit is formed in such a way that there is provided parallel to the divider capacitance associated with the control-grid cathode path an inductive resistance which adds to the divider capacitance for an oscillating circuit with a resonant frequency amounting to three times the operating frequency.

To obtain once more the desired approximately square-wave voltage characteristic during operation of the high-frequency generator after a frequency drift of the fundamental wave, the additional oscillating circuits tuned to three times the operating frequency can be provided with a frequency-trimming device. In addition or alternatively, both or one of the two additional points of resonance can also be designed to be greatly damped and wide-band.

DETAILED DESCRIPTION

Figure 1:
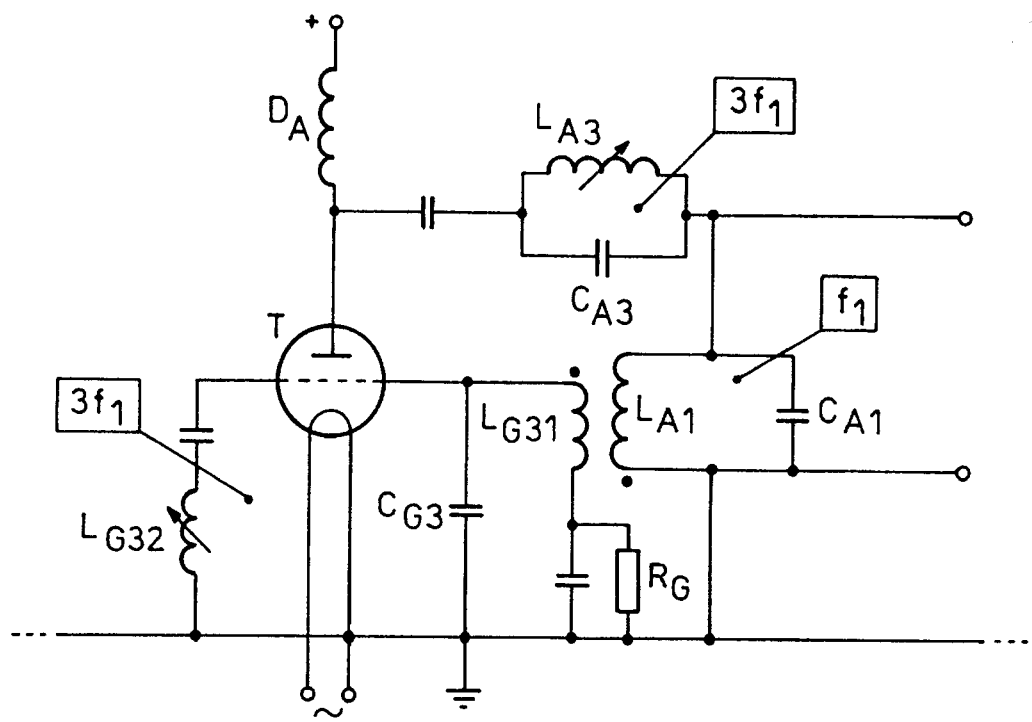
FIG. 1 shows a circuit arrangement with a modified Meißner feedback.

In the circuit arrangement according to FIG. 1, a parallel oscillating circuit is arranged in the anode circuit of the triode T, the parallel oscillating circuit consisting of the inductance $L_{A1}$ and the capacitance $C_{A1}$ and being tuned to the operating frequency $f_1$. The inductance $L_{A1}$ is part of a transformer, the secondary coil $L_{G31}$ of which lies in the grid circuit of the triode T. With the aid of this secondary coil a feedback of power takes place from the anode circuit to the control grid. A capacitance $C_{G3}$ and a further inductance $L_{G32}$ are arranged parallel to the secondary coil $L_{G31}$. The two inductances $L_{G31}$ and $L_{G32}$ form together with the capacitance $C_{G3}$ a parallel oscillating circuit which is tuned to three times the operating frequency $f_1$. A parallel oscillating circuit which is similar, i.e. likewise tuned to three times the operating frequency, is additionally arranged in the anode circuit and consists of the inductance $L_{A3}$ and capacitance $C_{A3}$. Moreover, the circuit arrangement contains usually in the anode supply a reactor $D_A$ and capacitors, not shown in more detail, to block direct voltages and to short circuit alternating voltages. The control grid of the triode is also usually connected by way of a resistance $R_G$ to the cathode connected to earth.

Figure 2:
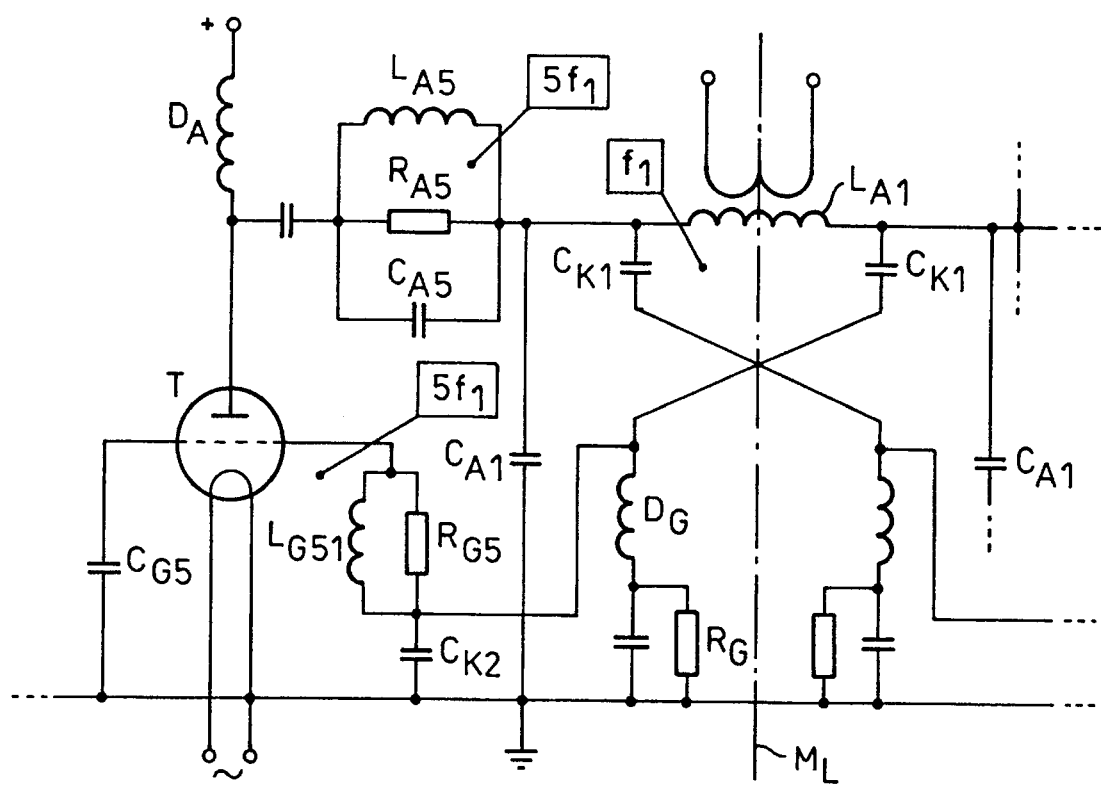
FIG. 2 shows a circuit arrangement with a modified push-pull circuit.

The circuit arrangement according to FIG. 2 shows the one half of a push-pull circuit formed in itself symmetrically to the centre line $M_L$. According to the representation, an oscillating circuit tuned to the operating frequency $f_1$ is arranged between the anodes of the two triodes T, to which circuit there belong, among other things, the inductance $L_{A1}$ and the capacitances $C_{A1}$ arranged on both sides. For the feedback of power from the anode circuit to the control grid of the two triodes two capacitive voltage dividers are provided, which consist of the capacitance $C_{K1}$ and the capacitance $C_{K2}$. The divider capacitance $C_{K2}$ in this respect consists at least in part of the internal tube capacitance between the grid and the cathode (base capacitance). Furthermore, in the anode circuit of each tube a parallel oscillating circuit is arranged which is tuned to five times the operating frequency $f_1$ and consists of the inductance $L_{A5}$ and the capacitance $C_{A5}$. A damping resistor $R_{A5}$ can be arranged parallel thereto. In the grid circuit a parallel oscillating circuit is likewise arranged which consists of the capacitance $C_{G5}$ and the inductance $L_{G51}$ as well as a line inductance which is conditional upon the circuit arrangement and is not described in more detail. The inductances and capacitances inherent in the circuit arrangement and additionally required in the form of discrete components usually have to be determined in terms of measuring technology. The oscillating circuit arranged in the grid circuit and tuned to the operating frequency $5\,f_1$ can also be additionally damped with the aid of a damping resistor $R_{G5}$. Moreover, the reactors $D_A$ and $D_G$ which are furthermore provided and capacitances which are not described in more detail serve in known manner to block or short circuit high-frequency voltages and direct voltages.

What is claimed is:

1. A self-starting high-frequency generator comprising:
   a) a grid-controlled electron tube having an anode circuit and a control-grid circuit;
   b) a first resonant circuit in the anode circuit tuned to an operating frequency;
   c) a second resonant circuit in the anode circuit tuned to a multiple of the operating frequency;
   d) a feedback circuit for feedback of power from the anode circuit to the control-grid circuit; and
   e) a resonant circuit in the control-grid circuit tuned to said multiple of the operating frequency, and including a component in common with the feedback circuit.

2. The high-frequency generator according to claim 1, further comprising a transformer having a primary winding and a secondary winding, wherein the control grid is coupled by means of the transformer to the anode oscillating circuit tuned to the operating frequency, and in that the secondary winding of the transformer at least partially forms the inductance of the oscillating circuit arranged in the control-grid circuit.

3. The high-frequency generator according to claim 1, further comprising:
   f) a second grid-controlled electron tube having an anode circuit and a control-grid circuit;
   g) a third resonant circuit in the anode circuit of the second electron tube, the third resonant circuit being tuned to the operating frequency;
   h) a fourth resonant circuit in the anode circuit of the second electron tube, the fourth resonant circuit tuned to the multiple of the operating frequency;
   i) a second feedback circuit for feedback of power from the anode circuit to the control-grid circuit of the second electron tube; and
   j) a resonant circuit in the control-grid circuit of the second electron tube tuned to said multiple of the operating frequency and including a component in common with the second feedback circuit, wherein each of the first and second feedback circuits consists of a capacitive voltage divider supplied in each case by an anode voltage on a push-pull side, wherein there is provided in parallel with the divider capacitance associated with a control-grid cathode path an inductive resistance which adds to the divider capacitance for a resonant circuit tuned to a multiple of the operating frequency.

4. The high-frequency generator according to claim 1, wherein the oscillating circuits tuned to the multiple of the operating frequency are provided with a frequency-trimming device.

5. The high-frequency generator according to claim 2, wherein the oscillating circuits tuned to the multiple of the operating frequency are provided with a frequency-trimming device.

6. The high-frequency generator according to claim 3, wherein the oscillating circuits tuned to the multiple of the operating frequency are provided with a frequency-trimming device.

7. The high-frequency generator according to claim 1, further comprising a damping resistor associated with one or both of the oscillating circuits tuned to the multiple of the operating frequency.

8. The high-frequency generator according to claim 2, further comprising a damping resistor associated with one or both of the oscillating circuits tuned to the multiple of the operating frequency.

9. The high-frequency generator according to claim 3, further comprising a damping resistor associated with one or both of the oscillating circuits tuned to the multiple of the operating frequency.

10. The high-frequency generator according to claim 4, further comprising a damping resistor associated with one or both of the oscillating circuits tuned to the multiple of the operating frequency.

11. The high-frequency generator according to claim 1, wherein the multiple of the operating frequency is three.

12. The high-frequency generator according to claim 2, wherein the multiple of the operating frequency is three.

13. The high-frequency generator according to claim 3, wherein the multiple of the operating frequency is three.

14. The high-frequency generator according to claim 4, wherein the multiple of the operating frequency is three.

15. The high-frequency generator according to claim 1, wherein the multiple of the operating frequency is five.

16. The high-frequency generator according to claim 2, wherein the multiple of the operating frequency is five.

17. The high-frequency generator according to claim 3, wherein the multiple of the operating frequency is five.

18. The high-frequency generator according to claim 4, wherein the multiple of the operating frequency is five.

* * * * *